United States Patent
Taguchi et al.

[11] Patent Number: 5,936,488
[45] Date of Patent: Aug. 10, 1999

[54] SURFACE ACOUSTIC WAVE FILTER HAVING INPUT AND OUTPUT TRANSDUCERS WITH DIFFERENT APERTURE LENGTHS

[75] Inventors: Yutaka Taguchi, Takatsuki; Kazuo Eda, Nara; Shunichi Seki, Amagasaki; Keiji Onishi, Settsu, all of Japan

[73] Assignee: Matsushita Electric Industrial Co., Ltd., Osaka, Japan

[21] Appl. No.: 08/788,527

[22] Filed: Jan. 24, 1997

[30] Foreign Application Priority Data

Jan. 26, 1996 [JP] Japan ................................. 8-011442

[51] Int. Cl.[6] ........................................ H03H 9/64
[52] U.S. Cl. ......................... 333/195; 333/196; 333/133; 310/313 C; 310/313 D
[58] Field of Search ................................. 333/193–196, 333/133; 310/313 R, 313 B, 313 C, 313 D

[56] References Cited

U.S. PATENT DOCUMENTS

| | | | |
|---|---|---|---|
| 4,353,046 | 10/1982 | Hartmann | 333/196 X |
| 4,425,554 | 1/1984 | Morishita et al. | 333/195 |
| 4,468,642 | 8/1984 | Hikita | 333/196 X |
| 5,471,178 | 11/1995 | Hickernell | 333/193 |
| 5,485,052 | 1/1996 | Seki et al. | 333/193 X |
| 5,568,002 | 10/1996 | Kawakatsu et al. | 333/193 X |
| 5,663,695 | 9/1997 | Tanaka et al. | 333/193 |
| 5,721,519 | 2/1998 | Onishi et al. | 333/194 X |

FOREIGN PATENT DOCUMENTS

| | | |
|---|---|---|
| 0 056 690 | 7/1982 | European Pat. Off. . |
| 0 392 879 | 10/1990 | European Pat. Off. . |
| 52-19044 | 2/1977 | Japan . |
| 58-154917 | 9/1983 | Japan . |
| 61-230419 | 10/1986 | Japan . |
| 1-231417 | 9/1989 | Japan . |
| 3-222512 | 10/1991 | Japan . |

OTHER PUBLICATIONS

Y Taguchi et al., "A New Balanced–Type RF–Band SAW Filter Using SAW Resonators", IEEE MTT–S International Microwave Symposium Digest, vol. 2, pp. 891–894, May 16–20, 1995.

European Search Report dated May 30, 1997.

Y. Taguchi et al., "A New Balanced–Unbalanced Type RF–Band SAW Filter", *IEEE MTT–S Digest*, pp. 417–420 (1996).

*Primary Examiner*—Benny Lee
*Assistant Examiner*—Barbara Summons
*Attorney, Agent, or Firm*—Ratner & Prestia

[57] ABSTRACT

A surface acoustic wave filter is provided which performs balanced signal/unbalanced signal conversion. The input and output impedances are different from each other. In a surface acoustic wave filter of the longitudinal mode type, a signal is applied to two terminals of an input interdigital transducer, or a signal is output from two terminals of an output interdigital transducer, thereby consituting a balanced type filter. The aperture length of the input interdigital transducer is different from that of the output interdigital transducer.

13 Claims, 8 Drawing Sheets

SURFACE ACOUSTIC WAVE FILTER HAVING INPUT AND OUTPUT TRANSDUCERS WITH DIFFERENT APERTURE LENGTHS

BACKGROUND OF THE INVENTION

1. Field of the Invention

The invention relates to a surface acoustic wave filter, and particularly to a surface acoustic wave filter which is used in a high-frequency region.

2. Related art of the Invention

Recently, studies on a surface acoustic wave device which can be used in a filter have been intensively conducted. In order to cope with recent development of mobile communications and increase of the frequency, particularly, development of a surface acoustic wave device has been vigorously made.

Conventionally, several kinds of filters which are configured by a surface acoustic wave device and which are used in the high-frequency band, particularly in the barnd of the hundreds of megahertz are known. Typical examples of such filters are as follows: a filter which is of the so-called ladder type and configured by plural surface acoustic wave resonators, such as that disclosed in Japanese patent publication (Kokai) No. SHO52-19044; a filter which is of the so-called multielectrode type, such as that disclosed in Japanese patent publication (Kokai) No. SHO58-154917; and a filter which is of the so-called longitudinal mode type and in which surface acoustic wave resonators are juxtaposed and coupling among the resonators are used, such as that disclosed in Japanese patent publications (Kokai) Nos. HEI32-222512, SHO61-230419, and HEI1-231417. Most of these filters handle an unbalanced signal and are set to have a characteristic impedance of 50 ohms in order to meet user requests.

Recently, there is a movement afoot to balance a high-frequency circuit in order to improve the performance of the circuit. In a high-frequency circuit of a portable phone or the like, for example, an unbalanced circuit is used in the high-frequency side and a balanced circuit in the low-frequency side. When a circuit is balanced, merits can be produced that the resistance to noise is improved and that the circuit can be driven at a lower voltage. However, such a balanced configuration requires circuit parts to be ready for a balanced circuit. In an unbalanced type circuit of the prior art, parts have an input/output impedance of 50 ohms. When a circuit is balanced, however, the impedance is not always 50 ohms. In a transitional period from an unbalanced circuit to a balanced circuit, particularly, parts are necessary which have unbalanced terminals at the input and balanced terminals at the output. An example of such parts is a balun. A balun has a configuration which can control the impedances of the balanced and unbalanced terminals. When a circuit of the prior art, i.e., an unbalanced circuit is to be used, however, a balun is not necessary. When a balun is used for deforming a circuit of the prior art into a balanced circuit, therefore, defects such as the increased cost of parts for the balun and the increased area required for mounting the balun are produced.

SUMMARY OF THE INVENTION

To comply with this, the inventors have thought that such a function or that performed by a balun may be added to a surface acoustic wave filter which is conventionally used. First, a modification of a filter of the longitudinal mode type has been invented as a system which receives an unbalanced signal and outputs a balanced signal or in reverse receives a balanced signal and outputs an unbalanced signal. Usually, a filter of the longitudinal mode type is configured as shown in FIG. 10. Reference numerals 1003-1 and 1003-2 designate reflectors, reference numeral 1004 designates one of the two input terminals and reference numberal 1005 designates one of the two output terminals. All of an input interdigital transducer 1001 and output interdigital transducers 1002-1 and 1002-2 are always used while the other input terminal and the other ouput terminal are grounded (in other words, both the input and the output handle an unbalanced signal). From the principle of generation of a surface acoustic wave, the electric signal/surface acoustic wave conversion ought to function even when signals which are shifted in phase from each other by 180 degrees are respectively applied to the two terminals or a balanced signal is input to the terminals. Also in the surface acoustic wave/electric signal conversion, it is considered that, in a propagating surface acoustic wave, the phases at two terminals of an interdigital transducer are shifted in phase from each other by 180 degrees and a balanced signal is output. When such a configuration is adopted, therefore, it is possible to attain a configuration in which the input signal is an unbalanced signal and the output signal is a balanced signal, or vice versa.

It is apparent that the input and output impedances depend on the product of the apeture length of an interdigital transducer and the number of pairs. As the product is larger, the impedances are lower, and, as the product is smaller, the impedances are higher. However, the number of pairs of an interdigital transducer is closely related to the band width of a filter. When the number of pairs is made smaller, for example, the band of a filter tends to be wider, and, when the number is made larger, the band of a filter tends to be narrower. In an actual use, the necessary band width is previously determined. In view of this, the number of pairs has a very small degree of freedom. When the aperture length of an input interdigital transducer is made different from that of an output interdigital transducer, or when the apeture length of one or both of the interdigital transducers is weighted, it is possible to control the input and output impedances.

In this way, according to the invention, a surface acoustic wave filter which is suitable for a balanced type circuit can be obtained. Furthermore, a surface acoustic wave filter in which the input and output impedances can be set to be different values can be obtained.

PREFERRED EMBODIMENTS

Hereinafter, embodiments of the invention will be described.

Embodiment 1

Figure 1:
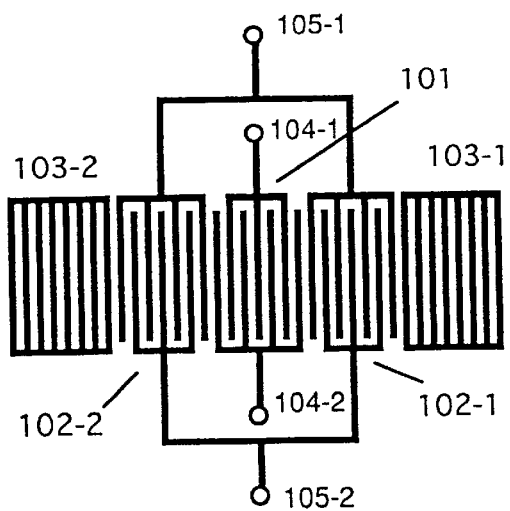
FIG. 1 is a view showing the configuration of a surface acoustic wave filter of Embodiment 1 of the invention.

Embodiment 1 of the invention will be described. A lithium niobate ($LiNbO_3$) substrate of 64°-Y-cut and X-propagation is used as the piezoelectric substrate, and a filter is configured using the substrate. FIG. 1 shows the electrode configuration. The reference numeral 101 designates an input interdigital transducer, 102-1 and 102-2 designate output interdigital transducers, 103-1 and 103-2 designate reflectors, 104-1 and 104-2 designate input terminals, and 105-1 and 105-2 designate output terminals. In the figure, for the sake of simplification, the interdigital transducers and the reflectors are shown in a reduced number.

Figure 2:
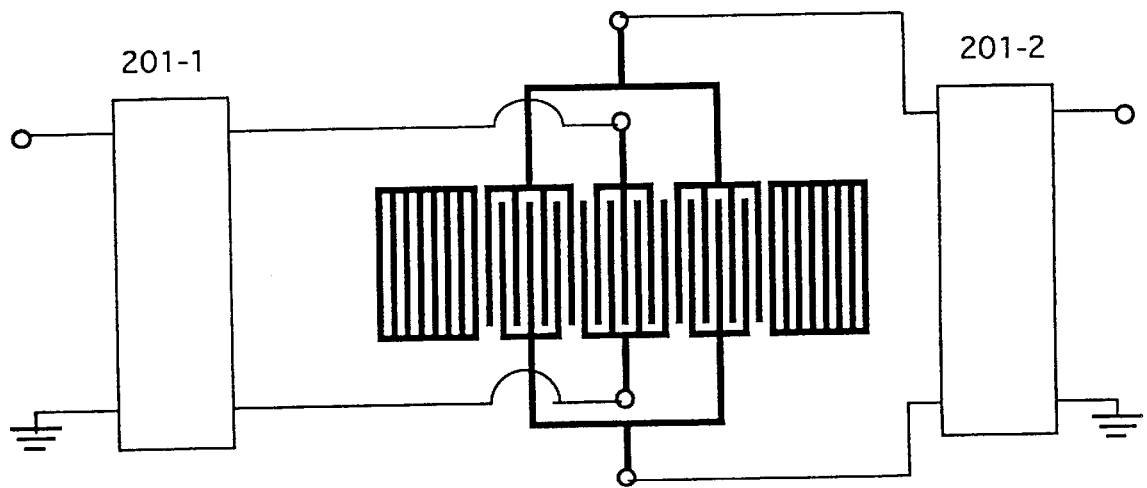
FIG. 2 is a view showing an example of a measuring circuit used in Embodiment 1.
Figure 3:
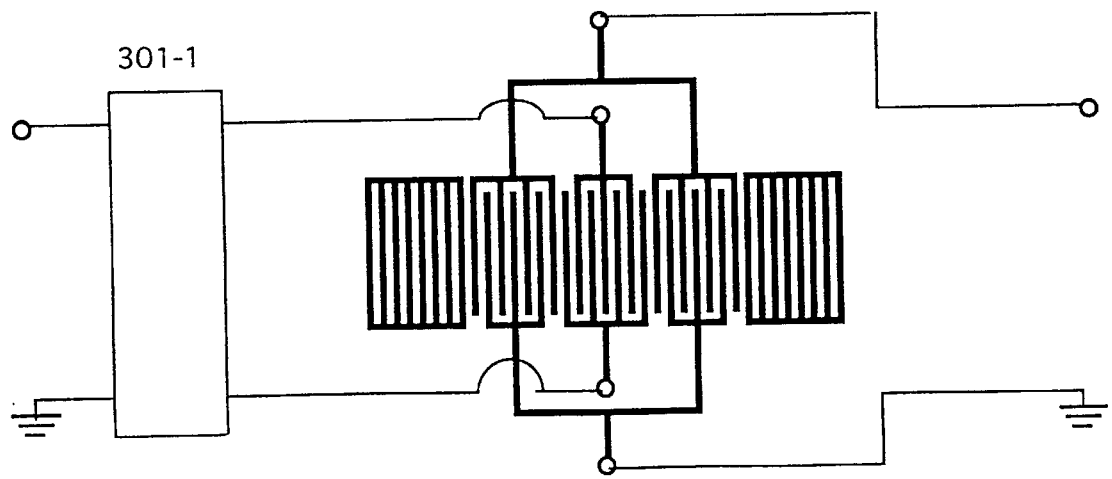
FIG. 3 is a view showing another example of the measuring circuit used in Embodiment 1.
Figure 11:
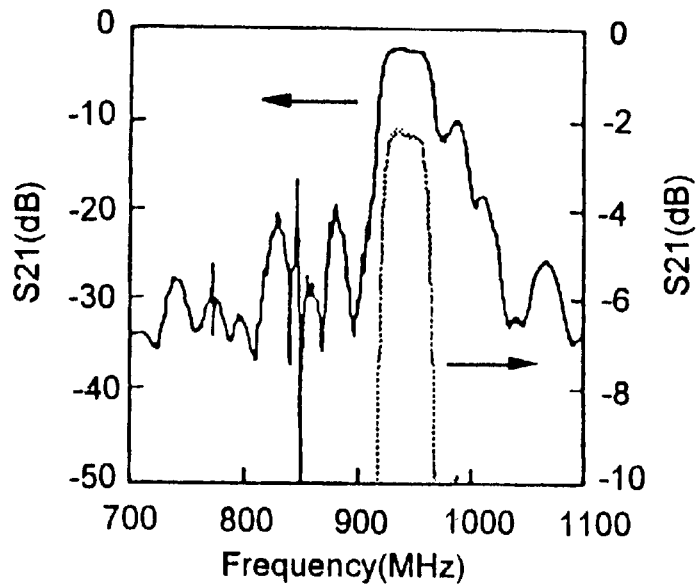
FIG. 11 is a view showing characteristics of the surface acoustic wave filter of the prior art.
Figure 12:
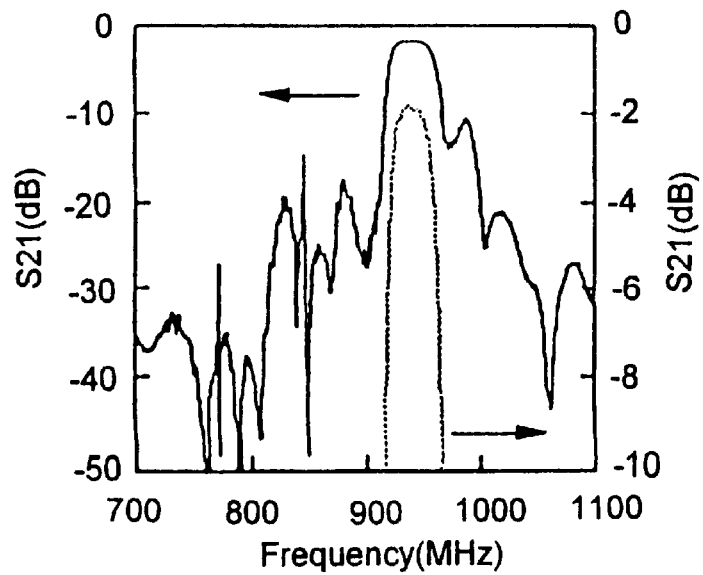
FIG. 12 is a view showing characteristics of the surface acoustic wave filter of Embodiment 1 of the invention.

The thus configured filter was connected to a measuring apparatus by using baluns 201-1 and 201-2 as shown in FIG. 2, and the characteristics of the filter were then measured. The baluns were used because of the following reason. A usual measuring apparatus is used for measuring an unbalanced signal and cannot measure a balanced signal. Therefore, the unbalanced signal/balanced signal conversion must be performed by using baluns. As a result of the measurement, the characteristics of the filter are substantially equal to those in the case of an unbalanced signal in the prior art. Similarly, also in the configuration shown in FIG. 3, the characteristics of the filter are measured, using balum 301-1 with the result that the characteristics of the filter were substantially equal to those in the case of an unbalanced signal in the prior art. FIG. 11 shows characteristics in the unbalanced signal/unbalanced signal case in the prior art, and FIG. 12 shows characteristics in the balanced signal/unbalanced signal case shown in FIG. 3.

Embodiment 2

Figure 4:
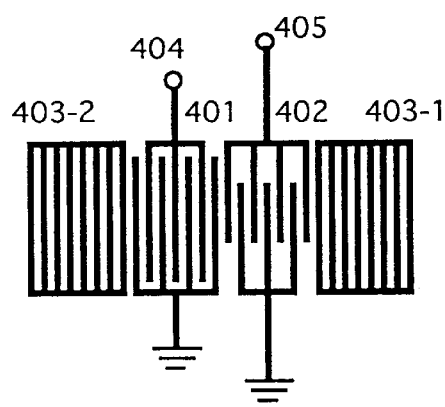
FIG. 4 is a view showing the configuration of a surface acoustic wave filter of Embodiment 2 of the invention.

Next, Embodiment 2 of the invention will be described. A lithium niobate ($LiNbO_3$) substrate of 64°-Y-cut and X-propagation is used as the piezoelectric substrate, and a filter is configured using the substrate. FIG. 4 shows the electrode configuration. The reference numeral 401 designates an input interdigital transducer, 402 designates an output interdigital transducer, 403-1 and 403-2 designate reflectors, 404 designates an input terminal, and 405 designates an output terminal. In the figure, for the sake of simplification, the interdigital transducers and the reflectors are shown in a reduced number. The aperture length of the output interdigital transducer 402 is smaller than that of the input interdigital transducer 401. In the filter, naturally, the output impedance is higher than the input impedance. Specifically, the filter is designed so that the input impedance is 50 ohms and the output impedance is 100 ohms.

An impedance matching circuit was connected to the output of the filter, and the characteristics of the filter were then measured. As a result, although the characteristics are slightly inferior to those of a filter of the prior art, the characteristics sufficiently satisfy the requirements for a filter.

Embodiment 3

Figure 5:
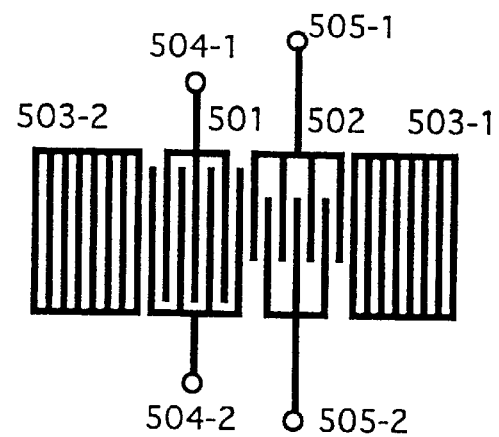
FIG. 5 is a view showing the configuration of a surface acoustic wave filter of Embodiment 3 of the invention.

Next, Embodiment 3 of the invention will be described. A lithium niobate ($LiNbO_3$) substrate of 64°-Y-cut and X-propagation is used as the piezoelectric substrate, and a, filter is configured using the substrate. FIG. 5 shows the electrode configuration. The reference numeral 501 designates an input interdigital transducer, 502 designates an output interdigital transducer, 503-1 and 503-2 designate reflectors, 504-1 and 504-2 designate input terminals, and 505-1 and 505-2 designate output terminals. In the figure, for the sake of simplification, the interdigital transducers and the reflectors are shown in a reduced number. The aperture length of the output interdigital transducer 502 is smaller than that of the input interdigital transducer 501. In the filter, naturally, the output impedance is higher than the input impedance. Specifically, the filter is designed so that the input impedance is 50 ohms and the output impedance is 100 ohms.

Figure 6:
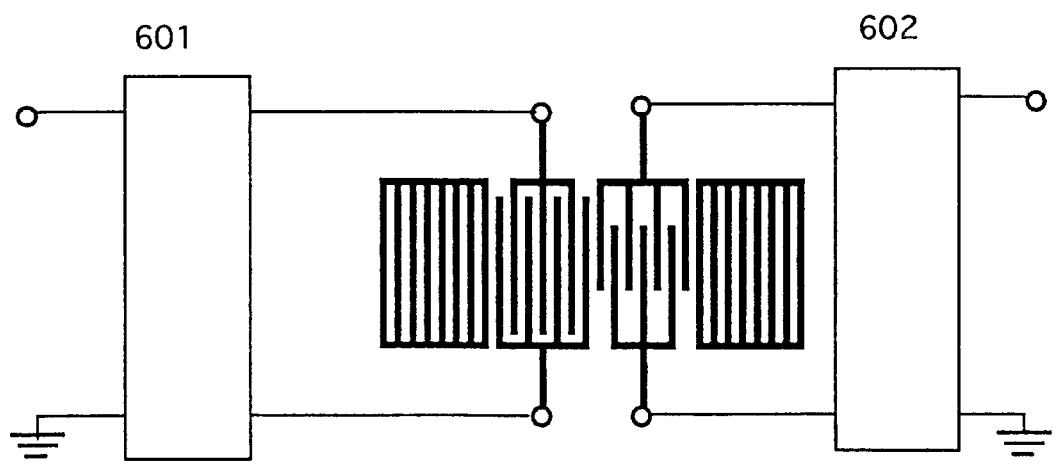
FIG. 6 is a view showing an example of a measuring circuit used in Embodiment 3.

The thus configured filter was connected to a measuring apparatus by using baluns 601 and 602 as shown in FIG. 6, and the characteristics of the filter were then measured. The balun 601 performs the balanced signal/unbalanced signal conversion of 50 ohms, and the balun 602 conducts the conversion between an unbalanced signal of 50 ohms and a balanced signal of 100 ohms. The baluns were used because of the following reason. A usual measuring apparatus is used for measuring an unbalanced signal and cannot measure a balanced signal. Therefore, the unbalanced signal/balanced signal conversion must be performed by using baluns. As a result of the measurement, the characteristics of the filter are substantially equal to those in the case of an unbalanced signal in the prior art.

Embodiment 4

Figure 7:
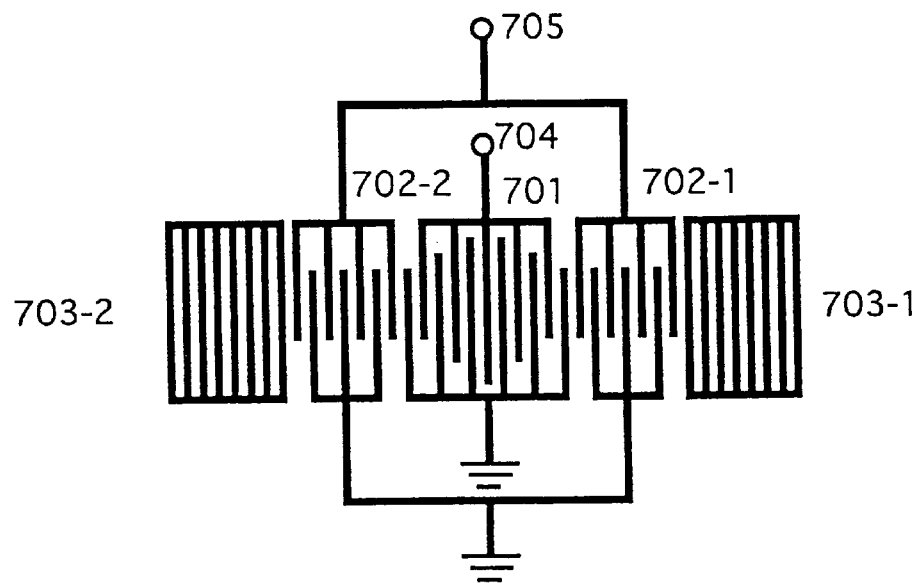
FIG. 7 is a view showing the configuration of a surface acoustic wave filter of Embodiment 4 of the invention.

Next, Embodiment 4 of the invention will be described. A lithium niobate ($LiNbO_3$) substrate of 64°-Y-cut and X-propagation is used as the piezoelectric substrate, and a filter is configured using the substrate. FIG. 7 shows the electrode configuration. The reference numeral 701 designates an input interdigital transducer, 702-1 and 702-2 designate output interdigital transducers, 703-1 and 703-2 designate reflectors, 704 designates an input terminal, and 705 designates an output terminal. In the figure, for the sake of simplification, the interdigital transducers and the reflectors are shown in a reduced number. The aperture length of the input interdigital transducer 701 is weighted. The aperture lengths of portions of the input interdigital transducer 701 which are nearest to the output interdigital transducers 702-1 and 702-2 are equal to those of the output interdigital transducers 702-1 and 702-2. This is conducted in order to allow a surface acoustic wave to efficiently propagate between the input and output interdigital transducers. As a result, the product of the apeture length and the number of pairs in the output interdigital transducers 702-1 and 702-2 are larger than those in the input interdigital transducer 701. In other words, in the filter, the output impedance is higher than the input impedance. The filter is designed so that the input impedance is 50 ohms and the output impedance is 100 ohms.

An impedance matching circuit was connected to the output of the filter, and the characteristics of the filter were measured. As a result, although the characteristics are slightly inferior to those of a filter of the prior art, the characteristics sufficiently satisfy the requirements for a filter.

In the embodiment, the aperture length of the input interdigital transducer 701 is weighted. Alternatively, the apeture lengths of the output interdigital transducers 70)2-1 and 702-2 may be weighted, or the aperture lengths of all the input and output interdigital transducers may be weighted. The manner of weighting is not restricted to the shape shown in the figure and weighting may be conducted in any manner.

Embodiment 5

Figure 8:
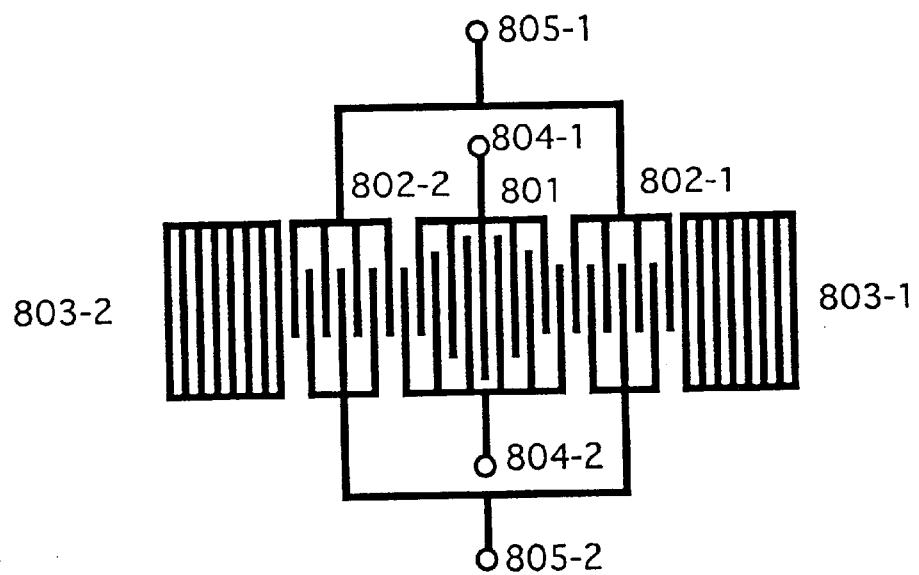
FIG. 8 is a view showing the configuration of a surface acoustic wave filter of Embodiment 5 of the invention.

Next, Embodiment 5 of the invention will be described. A lithium niobate (LiNbO$_3$) substrate of 64°-Y-cut and X-propagation is used as the piezoelectric substrate, and a filter is configured using the substrate. FIG. 8 shows the electrode configuration. The reference numeral 801 designates an input interdigital transducer, 802-1 and 802-2 designate output interdigital transducers, 803-1 and 803-2 designate reflectors, 804-1 and 804-2 designate input terminals, and 805-1 and 805-2 designate output terminals. In the figure, for the sake of simplification, the interdigital transducers and the reflectors are shown in a reduced number. The aperture length of the input interdigital transducer 801 is weighted. The aperture lengths of portions of the input interdigital transducer 801 which are nearest to the output interdigital transducers 802-1 and 802-2 are equal to those of the output interdigital transducers 802-1 and 802-2. This is conducted in order to allow a surface acoustic wave to efficiently propagate between the input and output interdigital transducers. As a result, the product of the apeture length and the number of pairs in the output interdigital transducers 802-1 and 802-2 is larger than that in the input interdigital transducer 801. In other words, in the filter, the output impedance is higher than the input impedance. The filter is designed so that the input impedance is 50 ohms and the output impedance is 100 ohms.

Figure 9:
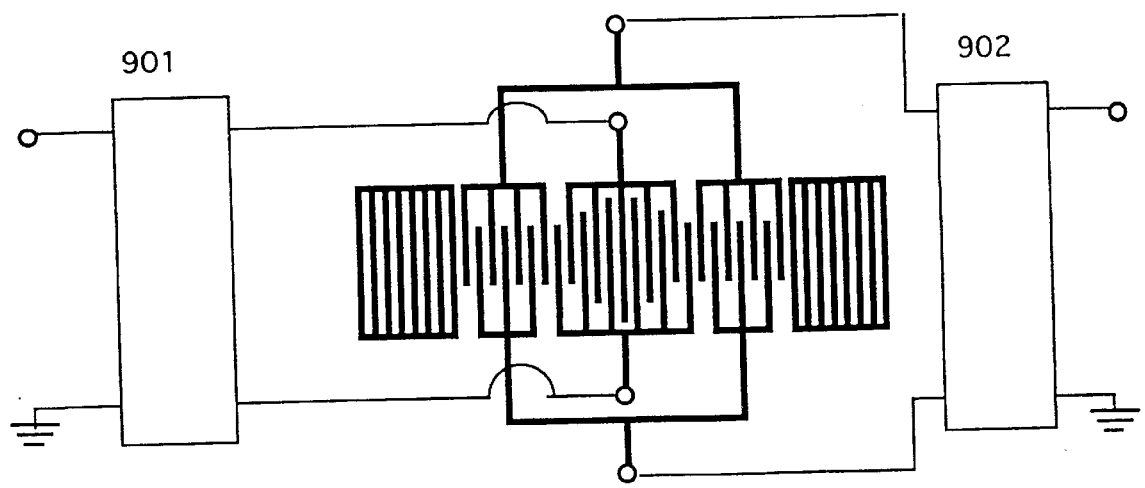
FIG. 9 is a view showing an example of a measuring circuit used in Embodiment 5.
Figure 10:
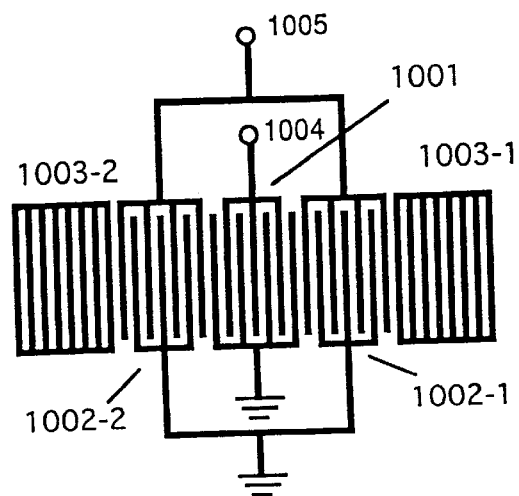
FIG. 10 is a view showing the configuration of a surface acoustic wave filter of the prior art.

The thus configured filter was connected to a measuring apparatus by using baluns 901 and 902 as shown in FIG. 9, and the characteristics of the filter were then measured. The balun 901 performs the balanced signal/unbalanced signal conversion of 50 ohms, and the balun 902 conducts the conversion between an unbalanced signal of 50 ohms and a balanced signal of 100 ohms. The baluns were used because of the following reason. A usual measuring apparatus is used for measuring an unbalanced signal and cannot measure a balanced signal. Therefore, the unbalanced signal/balanced signal conversion must be performed by using baluns. As a result of the measurement, the characteristics of the filter are substantially equal to those in the case of an unbalanced signal in the prior art.

In the embodiment, the aperture length of the input interdigital transducer 801 is weighted. Alternatively, the aperture lengths of the output interdigital transducers 802-1 and 802-2 may be weighted, or the aperture lengths of all the input and output interdigital transducers may be weighted. The manner of weighting is not restricted to the shape shown in the figure and weighting may be conducted in any manner.

Figure 13:
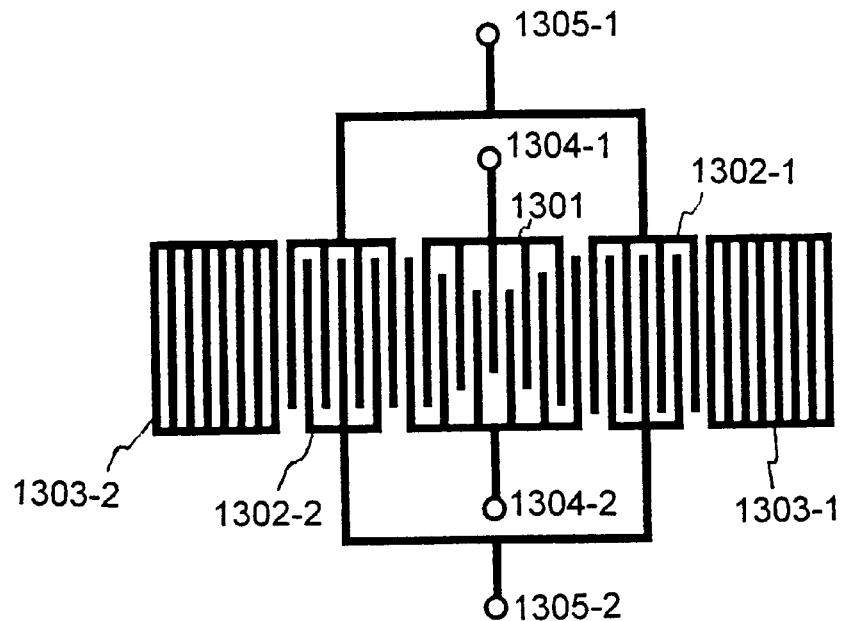
FIG. 13 is a view showing an example of a method of weighting the aperture length in Embodiment 5 of the invention.
Figure 14:
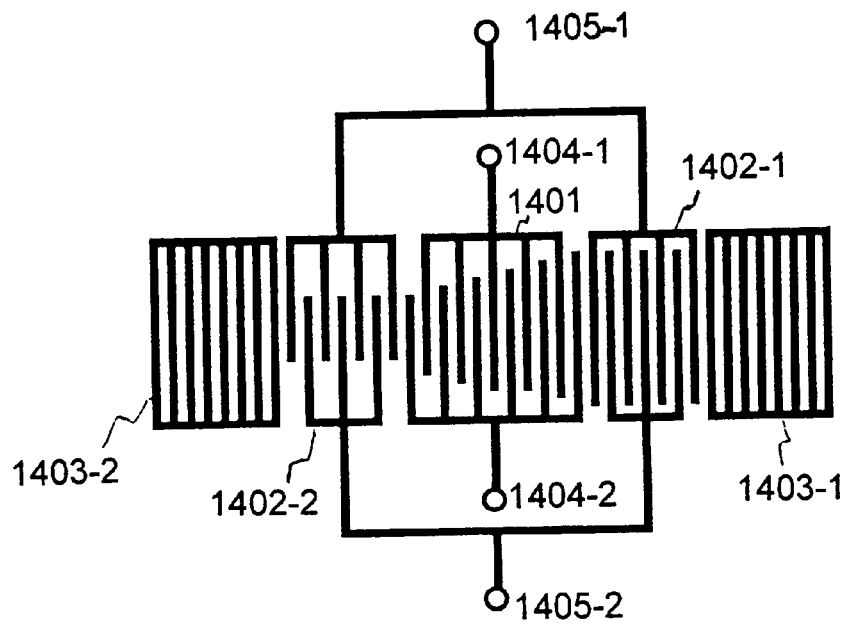
FIG. 14 is a view showing another example of a method of weighting the aperture length in Embodiment 5 of the invention.

FIGS. 13 and 14 show other examples of weighting, respectively. FIG. 13 shows a surface acoustic wave filter having a configuration in which the aperture length is smallest in the center portion of an input interdigital transducer 1301, and, as moving outward, the aperture length is gradually increased to a size which is equal to the aperture lengths of output interdigital transducers 1302-1L and 1302-2. In FIG. 13, reference numerals 1303-1 and 1303-2 designate reflectors. FIG. 14 shows a surface acoustic wave filter: having a configuration in which the aperture lengths of output interdigital transducers 1402-1 and 1402-1 are different from each other, and the aperture length of an input interdigital transducer 1401 positioned between the! output interdigital transducers is weighted so as to be varied from the aperture length of the output interdigital transducer 1402-1 to that of the output interdigital transducer 1402-2. In FIG. 14, reference numerals 1403-1 and 1403-2 designate reflectors. In the same manner as Embodiment 4, the configuration of FIG. 13 may be modified so that one of input terminals 1304-1 and 1304-2, or one of output terminals 1305-1 and 1305-2 is grounded, or one of the input terminals and one of the output terminals are grounded, and an unbalanced signal is input or output. The configuration of FIG. 14 may be modified so that one of input terminals 1404-1 and 1404-2, or one of output terminals 1405-1 and 1405-2 is grounded, or one of the input terminals and one of the output terminals are grounded, and an unbalanced signal is input or output.

Embodiment 6

Figure 15:
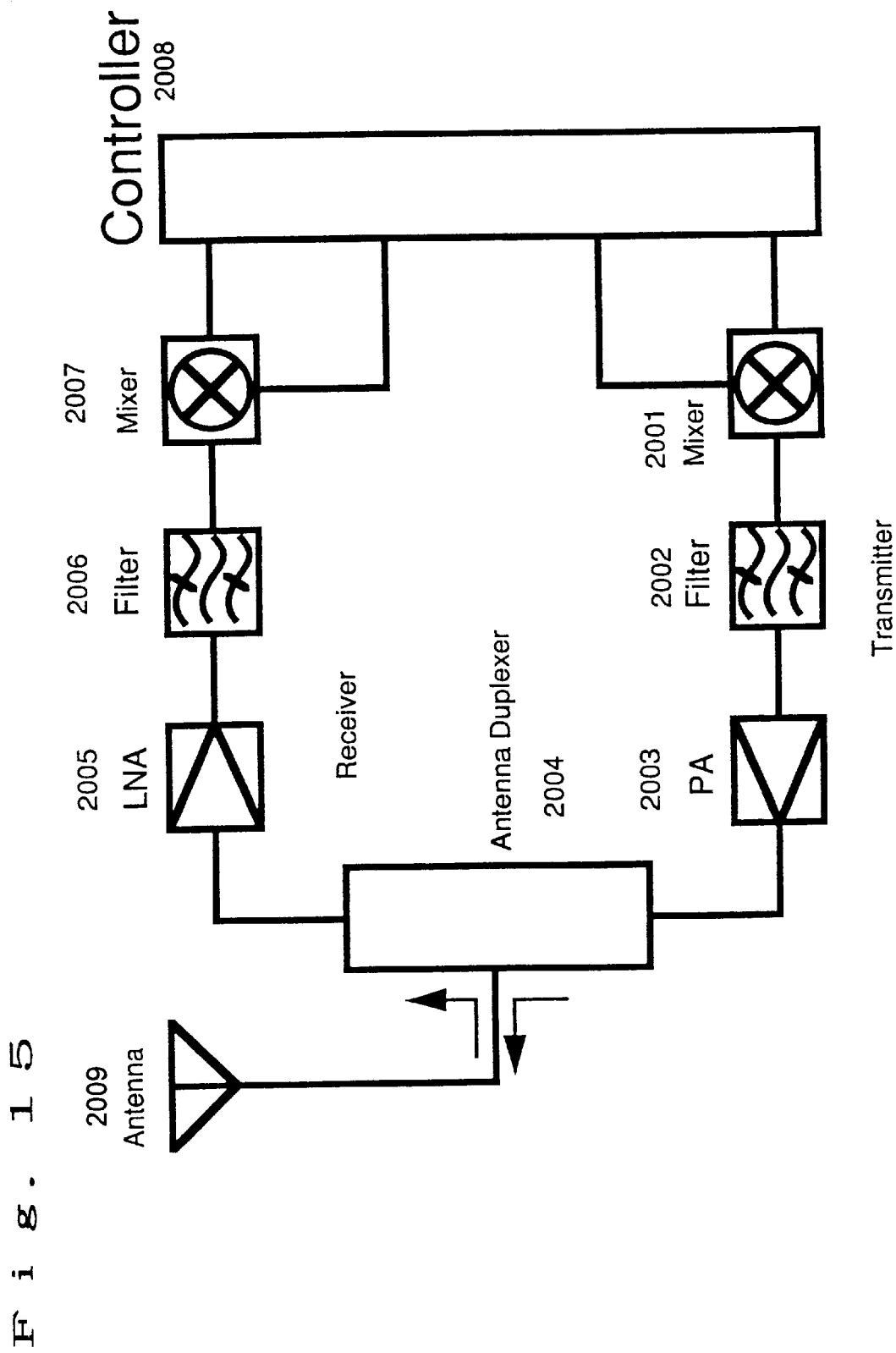
FIG. 15 is a block diagram showing a high-frequency portion of a signal transmitting/receiving apparatus of Embodiment 6 of the invention.

FIG. 15 is a block diagram showing a high-frequency portion of a signal transmitting/receiving apparatus of Embodiment 6 of the invention. The embodiment is a configuration illustrating an application example of the surface acoustic wave filters described above. For example, such a filter can be used between an unbalanced circuit in a high-frequency portion of a signal transmitting/receiving apparatus such as a portable phone, and a balanced circuit in a low-frequency portion such as a mixer. Referring to FIG. 15, in the transmitter side, a mixer 2001 mixes a modulated signal from a controller 2008 with a local signal so as to obtain a signal of a desired transmitting frequency. Usually, the mixer output signal is a balanced signal. The mixer output signal is supplied to a transmitting amplifier (PA) 2003 through a filter 2002. The transmitting amplifier (PA) 2003 is an unbalanced circuit. The transmitting amplifier (PA) 2003 amplifies the signal and the amplified signal is output through an antenna duplexer 2004 and an antenna 2009. The antenna 2009, the antenna duplexer 2004, and the transmitting amplifier (PA) 2003 constitute the transmitting means, and the mixer 2001 constitutes the frequency converting means.

By contrast, in the receiver side, a signal received by the antenna 2009 passes through the antenna duplexer 2004, and then amplified by a received-signal amplifier (LNA) 2005. Thereafter, a desired signal is extracted by a receiving filter 2006 and supplied to a receiving mixer 2007. In the front and rear of the receiving filter 2006, the received-signal amplifier (LNA) 2005 is an unbalanced circuit, and the receiving mixer 2007 is a balanced circuit. The antenna 2009, the antenna duplexer 2004, and the received-signal amplifier (LNA) 2005 constitute the receiving means, and the receiving mixer 2007 constitutes the frequency converting means.

Among the components of FIG. 15, the antenna 2009, the antenna duplexer 2004, the transmitting amplifier (PA) 200:3, and the received-signal amplifier (LNA) 2005 exhibit inferior characteristics when they are configured in the form of a balanced circuit. These circuits in the form of a balanced circuit remain to require a considerable time period for practical use. By contrast, even now, many kinds of balanced circuits can be used as the mixers 2001 and 2007, and characteristics of a mixer of the balanced type are superior. The use of the filters of the embodiments as the above-mentioned filters will result in the use of more excellent parts or circuits.

In Embodiment 6, an example in which the filter is used in a signal transmitting/receiving apparatus such as a portable phone has been described. It is a matter of course that an apparatus and location where the filter is used are not restricted to the above.

In the embodiments described above, two or three interdigital transducers are disposed between the reflectors. It is a matter of course that interdigital transducers of a number which is larger than three can be used.

In the embodiments described above, a lithium niobate (LiNbO$_3$) substrate of 64°-Y-cut and X-propagation is used as a piezoelectric member constituting a surface acoustic wave resonator. The invention is not restricted to this. It is a matter of course that, even when another kind of substrate such as a lithium tantalate (LiTaO$_3$) substrate or a quartz substrate is used, the same effects can be attained.

What is claimed is:

1. A surface acoustic wave filter comprising:
   a piezoelectric substrate;
   input means including a first interdigital transducer having a first plurality of aperture lengths which are all equal;
   output means including a second interdigital transducer having a second plurality of aperture lengths which are all equal, said first and second interdigital transducers being adjacently arranged on the piezoelectric substrate;
   means for at least one of (1) applying a signal to two terminals of said first interdigital transducer and (2) providing a signal from two terminals of said second interdigital transducer; and
   a plurality of surface acoustic wave reflectors disposed on both sides of the arrangement of said first and second interdigital transducers, said first plurality of aperture lengths being different from said second plurality of aperture lengths.

2. A surface acoustic wave filter comprising:
   a piezoelectric substrate;
   input means including a first interdigital transducer having a first plurality of aperture lengths which are all equal;
   output means including a second interdigital transducer having a second plurality of aperture lengths which are all equal, each one of said first and second interdigital transducers having two terminals, said first and second interdigital transducers being adjacently arranged on the piezoelectric substrate; and
   a plurality of surface acoustic wave reflectors disposed on both sides of the arrangement of said first and second interdigital transducers, said first aperture length being different from said second aperture length.

3. A surface acoustic wave filter according to claim 2, wherein
   said first interdigital transducer has a first input terminal and a second input terminal;
   said second interdigital transducer has a first output terminal and a second ouput terminal,
   further comprising means for at least one of (1) applying a signal to the first input terminal and the second input terminal of said first interdigital transducer and (2) providing a signal from the first ouput terminal and the second output terminal of said second interdigital transducer.

4. A signal receiving apparatus comprising:
   receiving means for receiving a signal;
   a surface acoustic wave filter according to claim 2 for extracting a desired signal from the received signal; and
   frequency converting means for converting the signal extracted by said surface acoustic wave filter into a signal having a predetermined frequency.

5. A signal transmitting apparatus comprising:
   frequency converting means for converting a signal into a signal having a predetermined frequency;
   a surface acoustic wave filter according to claim 2 for extracting a desired signal from the frequency-converted signal; and
   transmitting means for transmitting the signal extracted by the surface acoustic wave filter.

6. A surface acoustic wave filter according to claim 2, wherein said piezoelectric substrate is lithium niobate (LiNbO$_3$) having a 64° Y-cut.

7. A surface acoustic wave filter comprising:
   a piezoelectric substrate;
   input means including a first interdigital transducer having a first plurality of aperture lengths;
   output means including a second interdigital transducer having a second plurality of aperture lengths, each one of said first and second interdigital transducers having two terminals, said first and second interdigital transducers being adjacently arranged on the piezoelectric substrate;
   a plurality of surface acoustic wave reflectors disposed on both sides of the arrangement of said first and second interdigital transducers, at least one of said first plurality of aperture lengths and said second plurality of aperture lengths being weighted,
   one of a) all of said first aperture lengths and b) all of said second aperture lengths are equal; and
   a portion of one of said at least one weighted aperture lengths being substantially equal to the other aperture length, said portion being in the vicinity of said other interdigital transducer.

8. A surface acoustic wave filter according to claim 7, wherein said surface acoustic wave filter is included in a signal receiving apparatus which comprises:
   receiving means for receiving a signal; and
   frequency converting means for converting a signal extracted from the received signal by said surface acoustic wave filter into a signal having a predetermined frequency.

9. A surface acoustic wave filter according to claim 7, further comprising:
   means for at least one of (1) applying a signal to a first input terminal and a second input terminal of said two terminals of said first interdigital transducer and (2) providing a signal from a first output terminal and a second output terminal of said two terminals of said second interdigital transducer and
   at least one of said first aperture length and said second aperture length being weighted.

10. A signal receiving apparatus comprising:
    receiving means for receiving a signal;
    a surface acoustic wave filter according to claim 9, for extracting a desired signal from the received signal; and
    frequency converting means for converting the signal extracted by said surface acoustic wave filter into a signal having a predetermined frequency.

11. A signal transmitting apparatus comprising:
    frequency converting means for converting a signal into a signal having a predetermined frequency;

a surface acoustic wave filter according to claim 9 for extracting a desired signal from the frequency-converted signal; and transmitting means for transmitting the signal extracted by the surface acoustic wave filter.

12. A signal transmitting apparatus comprising:

frequency converting means for converting a signal into a signal having a predetermined frequency;

a surface acoustic wave filter according to claim 7 for extracting a desired signal from the frequency-converted signal; and transmitting means for transmitting the signal extracted by the surface acoustic wave filter.

13. A surface acoustic wave filter according to claim 7, wherein said surface acoustic wave filter is included in a signal transmitting apparatus which comprises:

frequency converting means for converting a signal into a further signal having a predetermined frequency; and transmitting means for transmitting a signal extracted from the further signal by the surface acoustic wave filter.

* * * * *